United States Patent [19]

Herko

[11] Patent Number: 5,053,705
[45] Date of Patent: * Oct. 1, 1991

[54] READ/WRITE COAXIAL MAGNETIC HEAD FOR USE WITH APPARATUS FOR MEASURING THE SURFACE OF SUPERCONDUCTORS

[75] Inventor: Samuel P. Herko, Ossining, N.Y.

[73] Assignee: North American Philips Corp., New York, N.Y.

[ * ] Notice: The portion of the term of this patent subsequent to Jul. 9, 2008 has been disclaimed.

[21] Appl. No.: 457,455

[22] Filed: Dec. 27, 1989

[51] Int. Cl.5 .............................................. G01R 33/12
[52] U.S. Cl. .................................... 324/240; 505/726; 505/843
[58] Field of Search ............... 324/228, 233, 239, 248, 324/209, 237, 238, 240; 505/726, 727, 843

[56] References Cited

U.S. PATENT DOCUMENTS

| | | | |
|---|---|---|---|
| 3,096,511 | 7/1963 | Taras | 360/53 |
| 3,636,437 | 1/1972 | Soulant, Jr. et al. | 324/209 |
| 4,190,799 | 2/1980 | Miller et al. | 324/233 X |
| 4,323,844 | 4/1982 | Mikame | 324/212 |
| 4,589,290 | 5/1986 | Sugiyama et al. | 324/209 X |
| 4,755,753 | 7/1988 | Chern | 324/237 |
| 4,864,236 | 9/1989 | Gibson et al. | 324/238 |

FOREIGN PATENT DOCUMENTS 1344155  1/1974  United Kingdom .

Primary Examiner—Kenneth A. Wieder
Assistant Examiner—Warren S. Edmonds
Attorney, Agent, or Firm—William L. Botjer

[57] ABSTRACT

A read/write head particularly suitable for mapping the superconductive properties of a sample of superconducting material. The head is arranged so that the reading and writing gaps are coaxial. Although the gaps are coaxial, the reading gap and the writing gap may be optimized in length and width to provide efficient reading and writing performance. The coaxial disposition of the heads eliminates parallax error to permit detailed mapping of the properties of the surface of a sample of superconductive material.

8 Claims, 5 Drawing Sheets

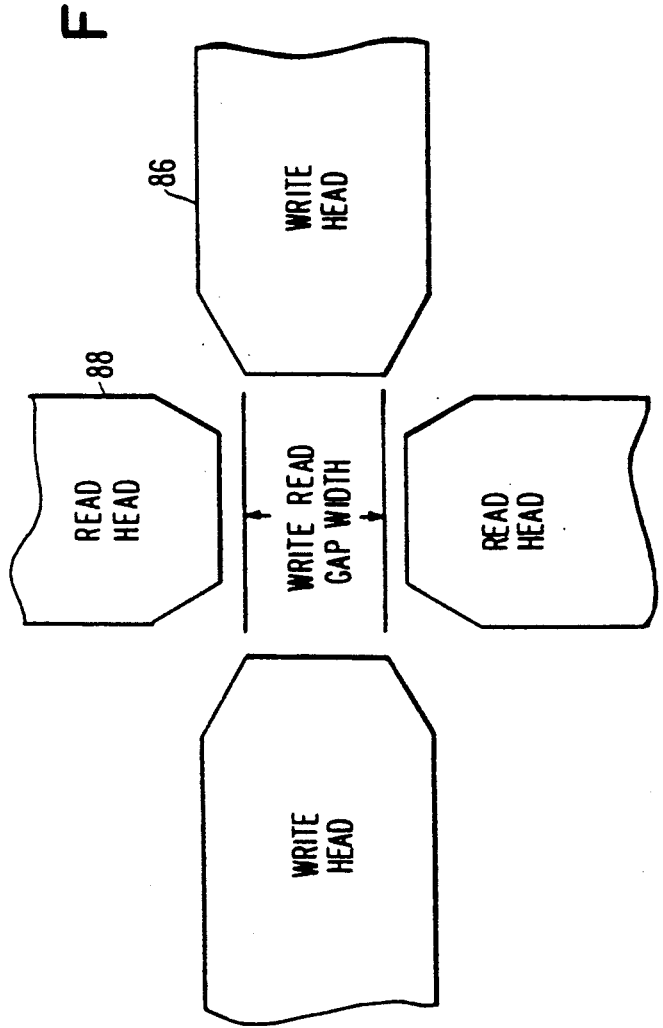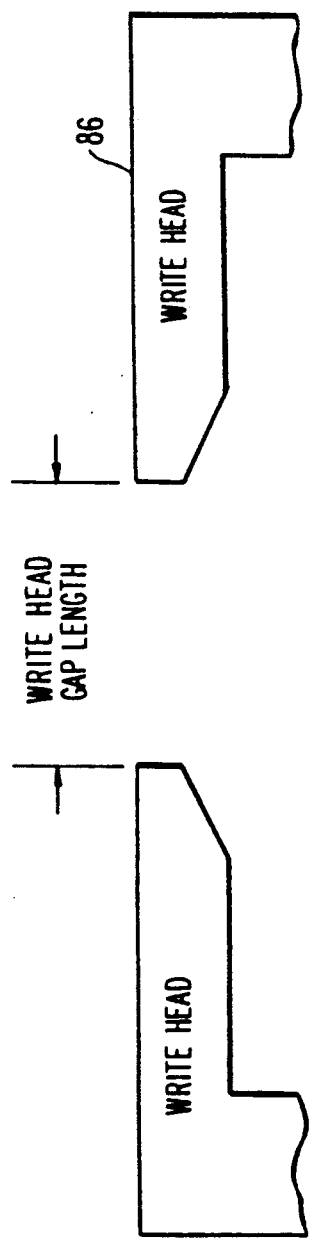

READ/WRITE COAXIAL MAGNETIC HEAD FOR USE WITH APPARATUS FOR MEASURING THE SURFACE OF SUPERCONDUCTORS

CROSS REFERENCE TO RELATED APPLICATIONS

This application is a Continuation-in-Part of application Ser. No. 07/455,719 filed Dec. 21, 1989, now U.S. Pat. No. 5,030,912.

BACKGROUND OF THE INVENTION

This invention relates to a device for testing samples of superconducting material. Specifically, the invention is directed to a read/write magnetic head suitable for determining the local superconducting properties of a sample of material, particularly thin film materials.

The device and methodology herein are related to the device and methodology of an earlier application entitled "Non Contact Test of Materials For Superconductivity" Ser. No. 380,162, filed on July 14, 1989 of which I am a co-inventor. The earlier application was directed to the detection of superconducting transitions in a sample as a whole. The present invention is directed to determining the superconducting properties of various portions of the surface of the sample. Additional background as to the testing of superconducting materials may also be found in application Ser. No. 416,286 entitled "Improved AC Magnetic Susceptometer and Methodology for Analyzing Magnetic Materials" filed Oct. 2, 1989. The disclosure of applications Ser. Nos. 380,162 and 416,286 are incorporated herein by reference as if fully set forth herein.

The discovery of high temperature superconductivity in Y-Ba-Cu-O has led to unprecedented research activity to find new higher temperature materials as well as to find applications for the existing new materials. In order to test the global superconducting properties of these materials resistivity measurements as well as magnetic tests for flux exclusion or flux expulsion (Meissner effect) are performed. Magnetic testing has the advantage of not requiring electrical contact, but neither test gives an indication of the local properties of the superconducting sample. Critical properties such as the transition temperature (Tc), critical current (Jc), and lower critical field (Hcl) may vary within a sample as a result of variations in composition and stoichiometry. It is important to detect such variations in applications where thin films are applied to electronic devices.

This application describes a magnetic read/write head that is particularly suitable for studying the surface and near surface of superconductors in both bulk and thin film forms. Using this coaxial head, maps of inhomogeneitites in superconducting properties can be generated.

SUMMARY OF THE INVENTION

The invention is based upon the local measurement of the magnetic response of a superconductor to alternating magnetic fields. Measurement of the time domain response provides information about the superconducting and non-superconducting regions. In addition, this device and methodology utilizes the effect of harmonic generation in the alternating response to map variations in the critical current (Jc) and the lower critical field (Hcl) in the sample.

In the invention a superconductor is held at a constant temperature cooler than its transition temperature (Tc) so that it is in a mixed state. A combined read/write magnetic head is held in close proximity to the surface of the superconductor. A sinusoidal field is produced at the gap of the write head. When the sample is driven into the mixed phase (e.g. by application of a steady bias field or by temperature adjustment), at some point the flux lines begin to penetrate the material and the magnetization induced by the sinusoidal field traverses the hysteresis loops. As a result of this nonlinear response, a nonsinusoidal voltage is induced across the gap of the read head, and components of the voltage at harmonics of the driving frequency are generated.

The read/write head is constructed so that its write gap and read gap are coaxial to eliminate parallax problems. The head is traversed over the cooled superconductor in the X and Y directions, a map of the superconductive and non-superconductive regions may be generated by monitoring the fundamental components of the response. Additionally, if the amplitude of the third harmonic signal is monitored, variations in the critical current and lower critical field may be mapped.

BRIEF DESCRIPTION OF THE DRAWINGS

For a better understanding of the invention, reference is made to the following drawings in which:

FIGS. 5a and 5b are enlarged views of the coaxial read/write gap.

DESCRIPTION OF THE PREFERRED EMBODIMENTS

Figure 1:
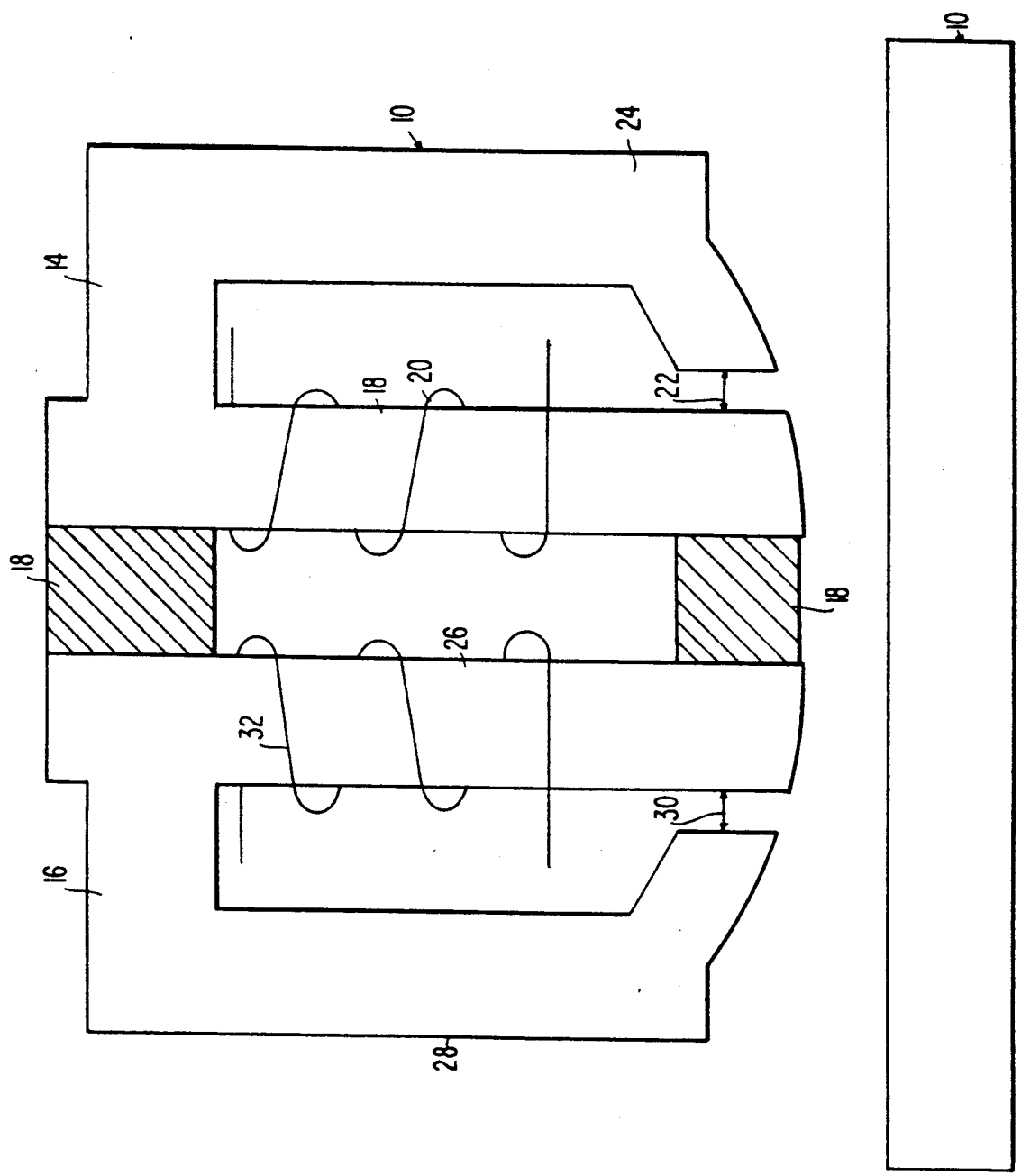
FIG. 1 is a perspective view of a first embodiment of a non-coaxial read/write magnetic head.

FIG. 1 illustrates a first embodiment of a read/write magnetic head assembly 10 which is used to map the surface of the superconducting sample of material 12. Read/write head assembly 10 includes a "write" core 14 and a "read" core 16 which are joined and separated by spacers 18. Disposed about a first core limb 18 of core 14 is an input coil 20 and a write gap 22 is formed between core limb 18 and the other limb 24. Read core 16 is formed by a first core limb 26 and includes a second core limb 28 with a read gap 30 disposed therebetween and a output coil 32 wound about a core limb 26. As shown in FIG. 1, head assembly 10 disposes the read and write heads in close proximity to each other to eliminate parallax between the reading and writing gaps.

Figure 2:
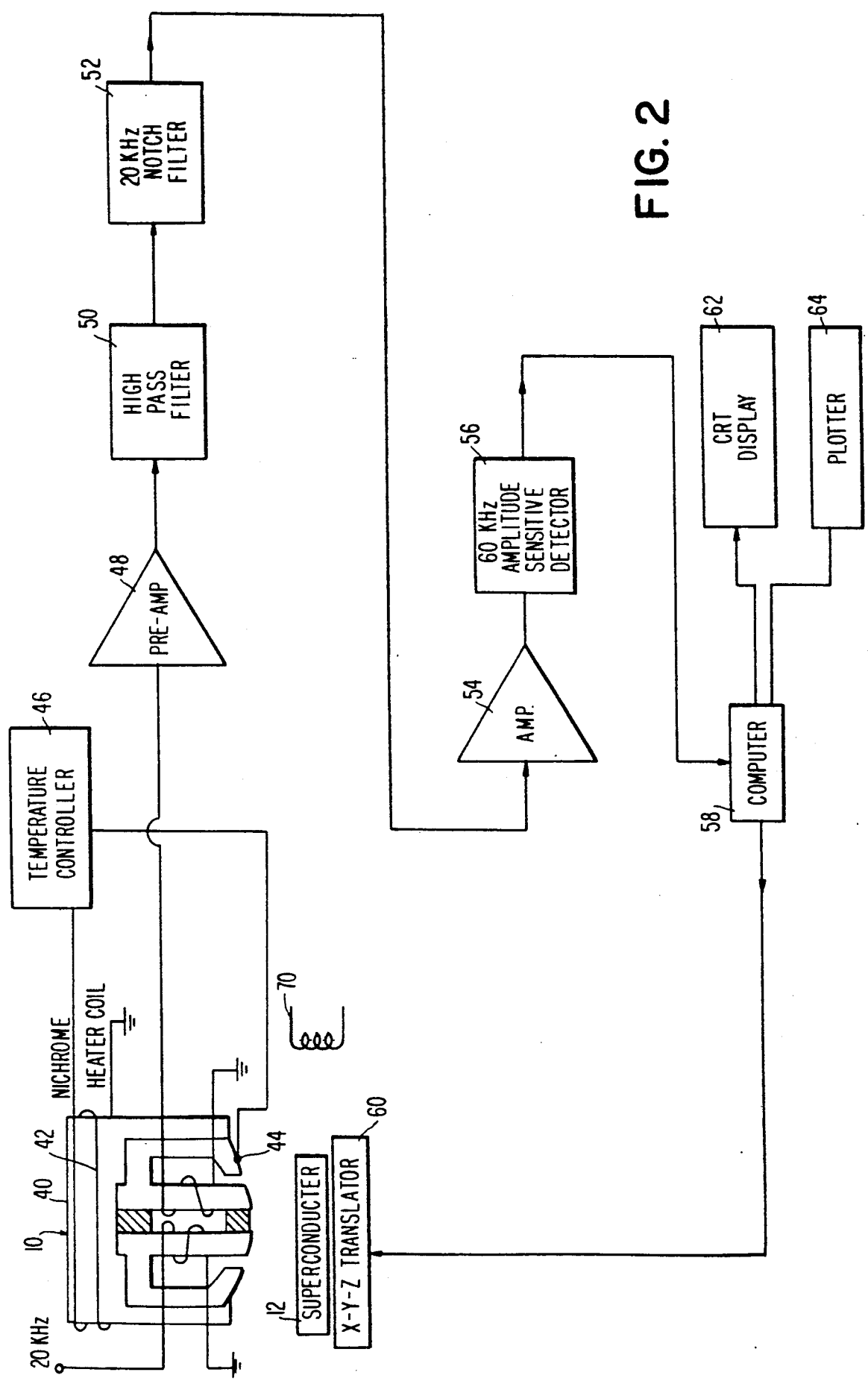
FIG. 2 is a schematic diagram of the system for mapping the superconductive properties of the sample of material to be tested.

As is shown in FIG. 2 read/write head assembly 10 is disposed within a housing 40 which has wound about it a heating coil 42 made of, for example nichrome Wire, in order to maintain read/write head assembly 10 at a suitable operating temperature in the presence of an environment of temperatures giving rise to superconductivity in the material to be mapped. Mounted on head assembly 10 is a temperature sensor 44 which is connected to a temperature controller 46 which is utilized to maintain head assembly 10 at a suitable operating temperature. Based on the temperature input from sensor 44 temperature controller 46 outputs appropriate current to heating coil 42 to maintain operating temperature. Temperature controller 46 may be any of a variety of well known temperature controlling devices. In use, the superconducting sample 12 is placed in an environment maintained at a constant temperature, cooler than its superconducting transition temperature by any suitable means (not shown). Sample 12 is cooled to a point such that it is in a mixed state, i.e. cooled to a temperature in the vicinity of and slightly below $T_c$. The mixed state may also be achieved by the application of an external bias field.

As is described in detail in the previous application entitled "Non Contact Test for Superconducting Materials" a 20 kHz signal is supplied to input coil 20 of write core 14. As set forth in the previous application, the application of an alternating magnetic field to superconducting material in a mixed state causes the generation of odd harmonics in the magnetization of the material. Read head 16 is used to detect the third harmonic output, in this case, 60 kHz. Accordingly, output coil 32 is coupled to a preamplifier 48 to raise its amplitude to easily detectable levels.

The output of pre-amplifier 40 is connected to a high pass filter 50 which attenuates frequencies below 20 kHz thus minimizing low frequency noise. The output of high pass filter 50 is applied to the input of a 20 kHz notch filter 52 which attenuates the 20 kHz fundamental signal and passes its harmonics. The "harmonics only" signal taken from notch filter 52 is applied to a further amplifier 54, the output of which is connected to a 60 kHz detector 56 which is utilized to determine the amplitude of the 60 kHz third harmonic of the input signal. The detection and amplitude of the 60 kHz signal indicates the presence of superconducting regions. The output of detector 56 is a DC voltage proportional to the amplitude of the 60 kHz signal.

The output of detector 56 is interfaced to a computer 58 which is utilized to store the amplitude of the 60 kHz signal as a function of the spatial position of the sample of superconducting material 12. To this end, computer 58 is interfaced to an X-Y-Z translator 60 upon which the sample 12 of superconducting material is placed. X-Y-Z translator 60 includes stepping motors in the X, Y and Z directions to scan the sample and position it in close proximity to head assembly 10. It is also noted that the head assembly 10 could be displaced rather than the translator 60 under the control of computer 58. In areas of varying superconducting strength, the amplitude of the third harmonic signal will change causing the output of detector 56 to change. These voltage variations are stored in computer 58 for further signal processing and may be output to either or both of a standard CRT display 62 or a hard copy plotter 64.

The resolving power of the device is directly related to the dimensions of the read/write head assembly 10. The gap lengths and widths as well as the distance between the read and write head 10 are relevant. By way of example only, successful superconducting mapping was achieved with a read/write head assembly of the following dimensions:
 read head gap width—0.00625 inches
 read head gap length—0.000045 inches
 write head gap width—0.00835 inches
 write head gap length—0.000070 inches
 distance between read and write head—0.030 inches
With the above head assembly the resolving power of the device is approximately limited to the distance between the heads, in this case, about i.e. 0.030 inches or 750 microns. However, this head assembly was capable of detecting a 200 micron stripe of non-superconductivity surrounded by a relatively large area of superconductive material. The distance between the sample 12 and head assembly 10 determines the strength of the 20 kHz input signal applied to the sample and the detectability of the 60 kHz third harmonic signal. The further the head assembly 10 is from the sample 12, the weaker the third harmonic signal will be. Accordingly, translatability of the sample and/or the head assembly in the Z dimension is desirable.

The components utilized to construct the circuitry of FIG. 2 are not critical. The amplifiers and filters used therein may be any suitable off-the-shelf item. Similarly, the computer, X-Y-Z translator and the computer display devices may be readily obtained and need not be specially modified. With respect to the read/write head shown in FIG. 1, this head may be readily adapted from the read/write head of a computer floppy disc drive. Such a head includes a writing and reading head in close proximity which are suitable for being driven at the frequencies noted herein. It is also noted that the invention is utilizable with frequencies other than 20 KHz. Finally, it is not necessary that the third harmonic component of the input signal be measured, any odd harmonic component can be measured. However, the third harmonic component is usually the strongest and thus most easily measured.

It should be noted that if one only wishes to map superconducting and non-superconducting regions it is not necessary to analyze the odd harmonic signals, as the output fundamental could be used. In such cases the above noted equipment is used with the fundamental suppressing filter 52 removed from the circuitry. In such a case, the phase relationship of the output fundamental signal to the input signal is measured. In superconducting regions the output fundamental signal will be 180° out of phase with the input signal. In non-superconducting regions the output fundamental signal will be in phase with the input. However, as is discussed below the measurement of the odd harmonic signals permits measurement of other critical properties such as critical current and lower critical field.

The application of a DC magnetic bias field in conjunction with the above described equipment permits the mapping of critical current (Jc) and lower critical field (Hcl). The amplitude of the applied DC bias field relative to the properties of the sample to be measured controls whether Jc or Hcl is measured.

In order to map lower critical field a DC bias field H is applied to the sample, by means of, for example, an external coil 70 surrounding sample 12 which is shown schematically in FIG. 2 When the head assembly 40 is traversed over the sample with an applied DC field any regions that are driven to a mixed state will cause the generation of the odd harmonic signals, and these regions may then be mapped. Thereafter, the amplitude of the applied bias field is increased and the process repeated. The value of the applied field H which causes the generation of harmonics in a particular region is then equal to or greater than the lower critical field for that region. By iterating the bias field H and thereafter rescanning the sample a map of the lower critical field across the sample is generated.

Figure 3:
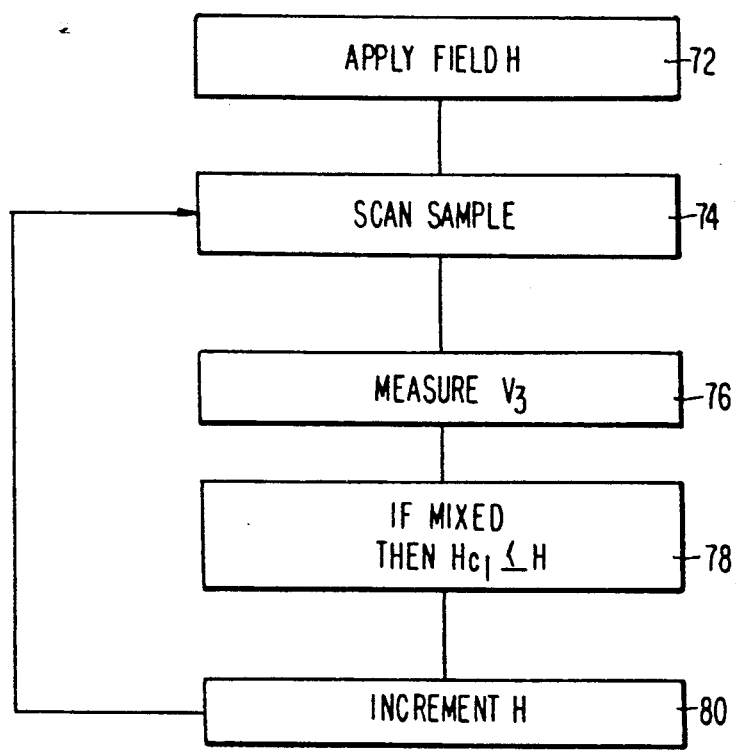
FIG. 3 is a flow chart of the methodology for measuring Hcl.

The flow chart of FIG. 3 illustrates the methodology for mapping Hcl. At step 72 a DC bias field H is applied to the sample 12 by external coil 70. Thereafter head assembly 40 is scanned across the sample at step 74 and a map of the amplitude of the third harmonic signal ($V_3$)

is generated at step 76. In those regions that are driven into the mixed state by the external field an odd harmonic signal will be generated. Those areas accordingly will have an $Hc_1 \leq H$ i.e. the Hcl in those areas will be less than or equal to the external field H which has been applied (step 78). Thereafter at step 80 the external bias field is incremented by a predetermined amount and the scan at step 74 is repeated. Again those regions now driven into the mixed state will have $Hcl \leq H$ (as incremented). In a similar manner the process is repeated until the entire sample is driven into a mixed state by the external field H. In this manner local variations in Hcl may be plotted.

The measurement of critical current (Jc) is also accomplished with the application of an external bias field H. In order to map Jc an external field H is applied such that the entire sample 12 is driven to a mixed state so that the response across the whole sample is non-linear. Thereafter, if the amplitude of the AC field applied by head assembly 40 is less than a value known as H* then the amplitude of the 3rd harmonic response V3 is inversely proportional to the critical current Jc:

$$V_3 \propto \frac{1}{Jc}$$

Accordingly, a mapping of the amplitude of the third harmonic signal is the inverse of the critical current Jc across the sample. Since $V_3$ is inversely proportional to Jc a map of Jc can easily be generated by computer 58 by inverting the plot of the amplitude of $V_3$. The theoretical underpinnings for these measurements may be found in C. P. Bean, Rev. Mod. Phys. 36, 31 (1964).

Figure 4A:
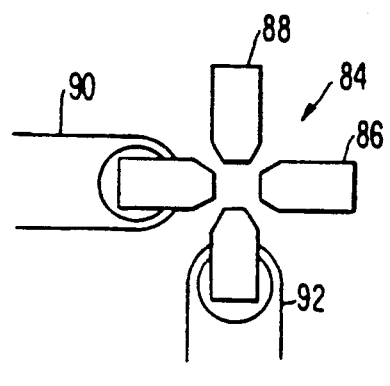
FIGS. 4a, 4b and 4c are top and side views of the coaxial read/write head of the invention.
Figure 4B:
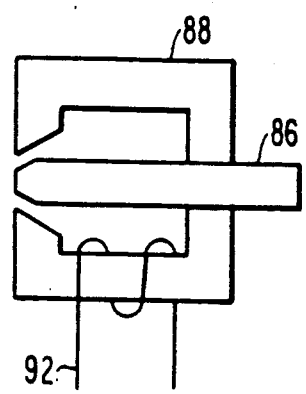
Figure 4C:
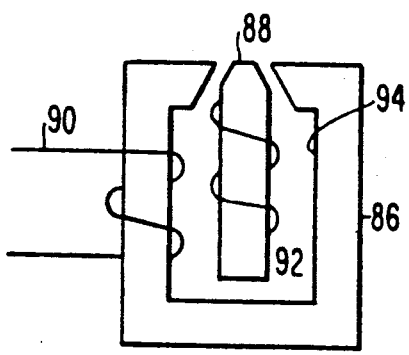

FIGS. 4 and 5 illustrate a second embodiment of a read/write magnetic head, in this embodiment, the read gap and the write gap are coaxial so that all parallax between the two heads is eliminated. As shown in FIG. 4, a coaxial read/write head 84 includes a C-shaped writing core 86 and a smaller, C-shaped reading core 88. Wound about one limb of write core 86 is a write coil 90. Similarly, wound around one limb of reading core 86 is a read coil 92. As can be seen in the top view of FIGS. 4 and 5, the cores 86, 88 are disposed perpendicularly to each other and the reading and writing gaps are coaxial with a line drawn normal to the page. The read 86 and write coil 88 may be bonded together with glass (not shown) to form a solid structure. A Ferrite or mu-metal shield may surround (also not shown) the two cores in order to reduce cross-coupling in the cores.

The construction of the coaxial read/write head 84 is such that the resolution of the superconducting map is no longer limited by the distance between the read and write head gaps, since they are now one and the same. However, even though the read and write gaps are now coaxial the present construction permits the gap lengths and widths to be optimized for the frequencies of interest at each head. The write head can be optimized for the 20 kHz drive frequency and the read head can be optimized for the 60 kHz third harmonic frequency. Such optimization will yield a head having a rectangular gap area as viewed form the top in FIG. 5 in which the write head has a longer gap length and width than that of the read head. As seen in FIG. 4, the read coil, 88 being optimized for higher frequencies is smaller and s such it fits within the central opening 94 of write core 86 which facilitates assembly.

As is the case with the non-coaxial head suitable exemplary dimensions for the read and write head gaps widths and lengths are:
read head gap width—0.00625 inches
read head gap length—0.000045 inches
write head gap width—0.00835 inches
write head gap length—0.000070 inches Of course, other gap lengths and widths may be used in accordance with the frequencies to be utilized in the measurements. Furthermore, while the above described coaxial head was manufactured with ferrite core materials, other types of core materials such as laminates may also be utilized in the above described coaxial arrangement.

Although the present invention has been described in conjunction with preferred embodiments it is to be understood that modifications and variations may be resorted to without departing from the spirit and scope of the invention, as those skilled in the art will readily understand. Such modifications and variations are considered to be within the purview and scope of the invention and the appended claims.

What is claimed is:

1. In a device for mapping the superconductive regions of a sample of superconducting material, said device having means for inducing an alternating magnetic field in at least a portion of the sample, means for measuring odd harmonic components of the induced magnetic field, means for displacing said inducing and measuring means and said sample relative to each other and means for storing the amplitude of the harmonic component as a function of location in the sample of material, the improvement comprising:
    wherein the means for inducing an alternating magnetic field comprise a magnetic writing head including a writing gap, said means for measuring the odd harmonic components comprise a magnetic reading head having a reading gap, said magnetic writing head and said magnetic reading head being disposed so that said writing gap of said writing head and said reading gap of said reading head comprise for at least a portion of their length and width the same gap.

2. The device as claimed in claim 1, wherein said reading head and said writing head are disposed perpendicularly with respect to each other.

3. The device as claimed in claim 1, wherein said reading head and said writing head comprise C-shaped cores of differing size.

4. The device as claimed in claim 1, wherein said writing head is larger than said reading head.

5. The device as claimed in claim 1, wherein the gap length of said writing head is larger than the gap length of said reading head.

6. The device as claimed in claim 1, wherein said reading head and said writing head comprise C-shaped ferrite cores.

7. The device as claimed in claim 4, wherein said reading head is disposed within the central opening of said writing head.

8. The device as claimed in claim 1, wherein said same gap is rectangular in dimension.

* * * * *